(12) United States Patent
Chang et al.

(10) Patent No.: US 7,015,839 B1
(45) Date of Patent: Mar. 21, 2006

(54) MAPPING METHOD UTILIZING LOOK-UP TABLE AND RELATED APPARATUS

(75) Inventors: Hsien-Chun Chang, Chi-Lung (TW); Jin-Sheng Gong, Tao-Yuan Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 10/905,492

(22) Filed: Jan. 6, 2005

(51) Int. Cl.
*H03M 7/00* (2006.01)

(52) U.S. Cl. .................................... 341/106
(58) Field of Classification Search ............... 358/517, 358/518, 519, 520, 521, 523, 524; 341/50, 341/51, 106, 107, 61; 382/515, 232; 345/191
See application file for complete search history.

(56) References Cited

U.S. PATENT DOCUMENTS

| | | | |
|---|---|---|---|
| 4,538,299 A * | 8/1985 | DeForest | ..................... 382/197 |
| 5,471,411 A * | 11/1995 | Adams et al. | ............. 708/300 |
| 5,781,903 A * | 7/1998 | Rusterholz | .................. 707/100 |
| 5,937,088 A | 8/1999 | Hsu | |
| 6,122,640 A * | 9/2000 | Pereira | ................... 707/103 R |
| 6,446,259 B1 * | 9/2002 | Brett | ........................... 717/165 |
| 2003/0123304 A1 | 7/2003 | Wei et al. | |

* cited by examiner

*Primary Examiner*—Brian Young
(74) *Attorney, Agent, or Firm*—Winston Hsu

(57) ABSTRACT

A method includes utilizing the look-up table to store a plurality of basic values and a plurality of delta value sets, wherein each of the delta value sets represents a difference between a corresponding basic value and another basic value adjacent to the corresponding basic value; determining a first basic value and a first delta value set according to an input value; and generating an output value according to the first basic value and the first delta value set.

14 Claims, 3 Drawing Sheets

US 7,015,839 B1

MAPPING METHOD UTILIZING LOOK-UP TABLE AND RELATED APPARATUS

BACKGROUND OF INVENTION

1. Field of the Invention

The invention relates to a look-up table, and more particularly, to a look-up table architecture.

2. Description of the Prior Art

Look-up tables (LUTs) are a circuit component frequently used in many kinds of electronic devices. Using a look-up table as an auxiliary tool in a mapping apparatus, an output value of a complex mathematical function corresponding to an input value could be easily determined according to the data stored in the look-up table. Hence, a complicated computing process and delay caused by the complicated computing process could be avoided.

A look-up table is always implemented through using a memory (such as a SRAM or other kinds of memory). The memory size determines the price of a memory. Some conventional methods for improving memory usage of look-up table mapping are developed. For example, U.S. Pat. No. 5,937,088 is related to "An apparatus and a method for improving memory usage of look-up table mapping", and U.S. Pub. No. 2003/0123304 is related to "Look-up table methods for reducing the use of memory volume and system thereof".

SUMMARY OF INVENTION

It is one of many objectives of the claimed invention to provide a mapping apparatus and a method thereof to reduce used memory size.

It is another one of many objectives of the claimed invention to provide a mapping apparatus and a method thereof to enhance the utilization efficiency of the look-up table.

According to the claimed invention, a mapping method is disclosed. The mapping method includes utilizing the look-up table to store a plurality of basic values and a plurality of delta value sets, wherein a basic value corresponds to a delta value set; determining a first basic value and a first delta value set according to an input value and generating an output value according to the first basic value and the first delta value set.

According to the claimed invention, a mapping apparatus is disclosed. The apparatus includes a look-up table for storing a plurality of basic values and a plurality of delta value sets, and determining a first basic value and a first delta value set according to an input value; and the arithmetic circuit coupled to the look-up table for generating an output value according to the first basic value and the first delta value set.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
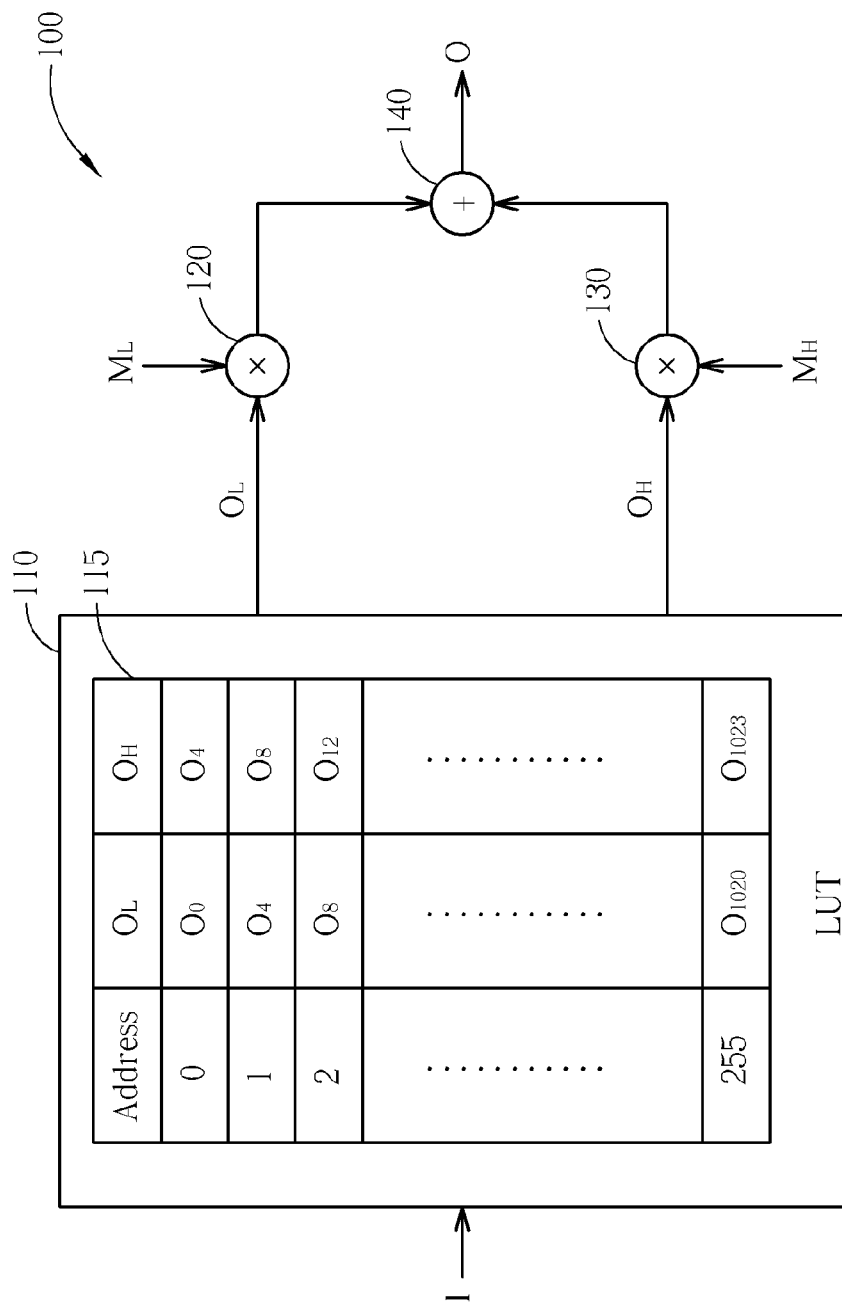
FIG. 1 shows a block diagram of a mapping apparatus according to a first embodiment of the present invention.

FIG. 1 shows a mapping apparatus 100 according to a first embodiment of the present invention. The mapping apparatus 100 shown in FIG. 1 comprises a look-up table (LUT) 110, a first multiplier 120, a second multiplier 130, and an adder 140. The LUT 110 is realized by a memory 115. According to an input value I, the LUT 110 outputs a first output value $O_L$ and a second output value $O_H$. Preferably, for reducing the memory access time, both the first output value $O_L$ and the second output value $O_H$ are stored corresponding to a same input value, hence accessing the memory 115 once would be enough to get two output values. The first multiplier 120 multiplies the first output value $O_L$ with a first multiplicand $M_L$; and the second multiplier 130 multiplies the second output value $O_H$ with a second multiplicand $M_H$. Both the first multiplicand $M_L$ and the second multiplicand $M_H$ are determined according to the input value I. The adder 140 adds the resulting products to generate an output value O. In this embodiment, it is assumed that the mapping apparatus 100 is used to implement a mathematical function having 1024 input values (from $I_0$~$I_{1023}$) and 1024 corresponding output values (from $O_0$~$O_{1023}$). When $I_3$ is used as the input value I, the first output value $O_L$ and the second output value $O_H$ are $O_0$ and $O_4$ respectively, and the first multiplicand $M_L$ and the second multiplicand $M_H$ are ¼ and ¾ respectively. Hence, the output value O is $O=¼×O_0+¾×O_4$. When $I_6$ is used as the input value I, the first output value $O_L$ and the second output value $O_H$ are $O_4$ and $O_8$ respectively, and the first multiplicand $M_L$ and the second multiplicand $M_H$ are both ²⁄₄. Hence, the output value O is $O=²⁄₄×O_4+²⁄₄×O_8$.

In a second embodiment of the present invention, a memory is utilized to store a plurality of basic values and a plurality of delta value sets (each delta value set includes a single delta value or more than one delta values). In the memory, a basic value corresponds to a delta value set, and the delta value set represents a difference between the basic value and another basic value adjacent to the basic value in the memory.

Figure 2:
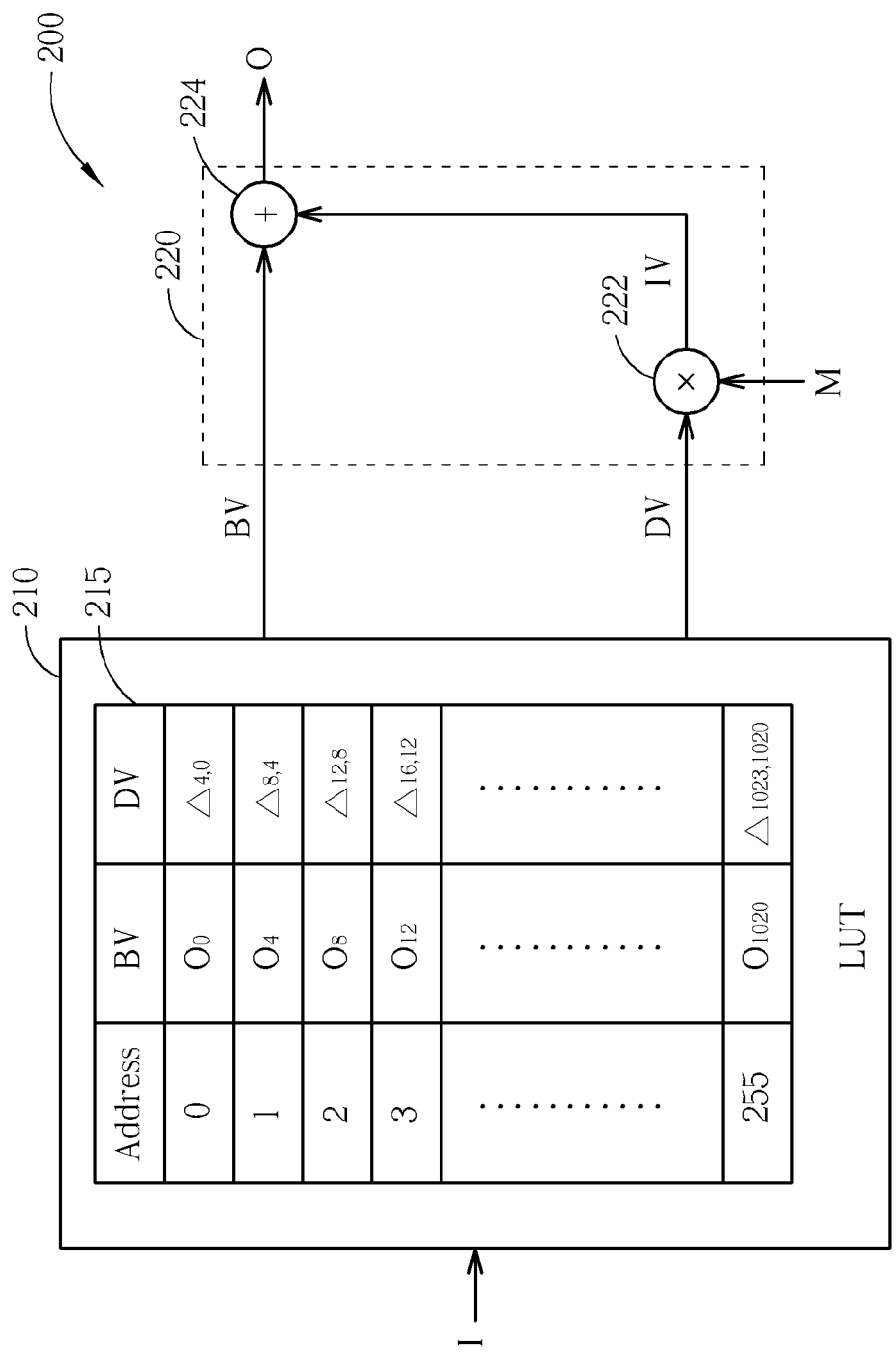
FIG. 2 shows a block diagram of a mapping apparatus according to a second embodiment of the present invention.

FIG. 2 shows a mapping apparatus 200 according to the second embodiment of the present invention. The mapping apparatus 200 generates an output value O according to an input value I. The mapping apparatus 200 comprises a look-up table 210 and an arithmetic circuit 220. The look-up table 210 includes a memory 215, and the memory 215 is utilized to store a plurality of basic values and a plurality of delta value sets (in this embodiment, each delta value set contains only one delta value). In the memory 215, a basic value corresponds to a delta value, and the delta value represents a difference between the basic value and another basic value adjacent to the basic value. For example, assume that the mapping apparatus 200 is used to implement a mathematical function having 1024 input values (from $I_0$~$I_{1023}$) and 1024 corresponding output values (from $O_0$~$O_{1023}$), the plurality of basic values could be set as $O_0$, $O_4$, $O_8$, $O_{12}$, . . . $O_{1020}$, and the plurality of corresponding delta value sets (i.e. the plurality of corresponding delta values, since one delta value set contains only one delta value) would be $\Delta_{4,0}$, $\Delta_{8,4}$, $\Delta_{12,8}$, $\Delta_{16,12}$, . . . , $\Delta_{1023,1020}$, where $\Delta_{m,n}=O_m-O_n$ represents a difference between two basic values $O_m$ and $O_n$.

The arithmetic circuit 220 includes a multiplier 222 and an adder 224. The multiplier 220 multiplies a delta value DV outputted by the LUT 210 with a multiplicand M to generate an increment value IV, where M is determined according to the input value I (ex. M=(I mod 4)/4). The adder 224 adds a basic value BV outputted by the LUT 210 with the increment value IV to generate the output value O.

Please take a look at some specific examples. When $I_7$ is used as the input value I, the LUT 210 outputs $O_4$ and $\Delta_{8,4}$ as the basic value BV and the delta value DV respectively. The multiplicand M is set as ¾ (since (7 mod 4)/4=¾). Hence, the output value O is $O=O_4+(¾)\times\Delta_{8,4}$. Similarly, when $I_{12}$ is used as the input value I, the LUT 210 outputs $O_{12}$ and $\Delta_{16,12}$ as the basic value BV and the delta value DV respectively. The multiplicand M is set as 0 (since (12 mod 4)/4=0). Hence, the output value O is $O=O_{12}+0\times\Delta_{16,12}=O_{12}$.

Figure 3:
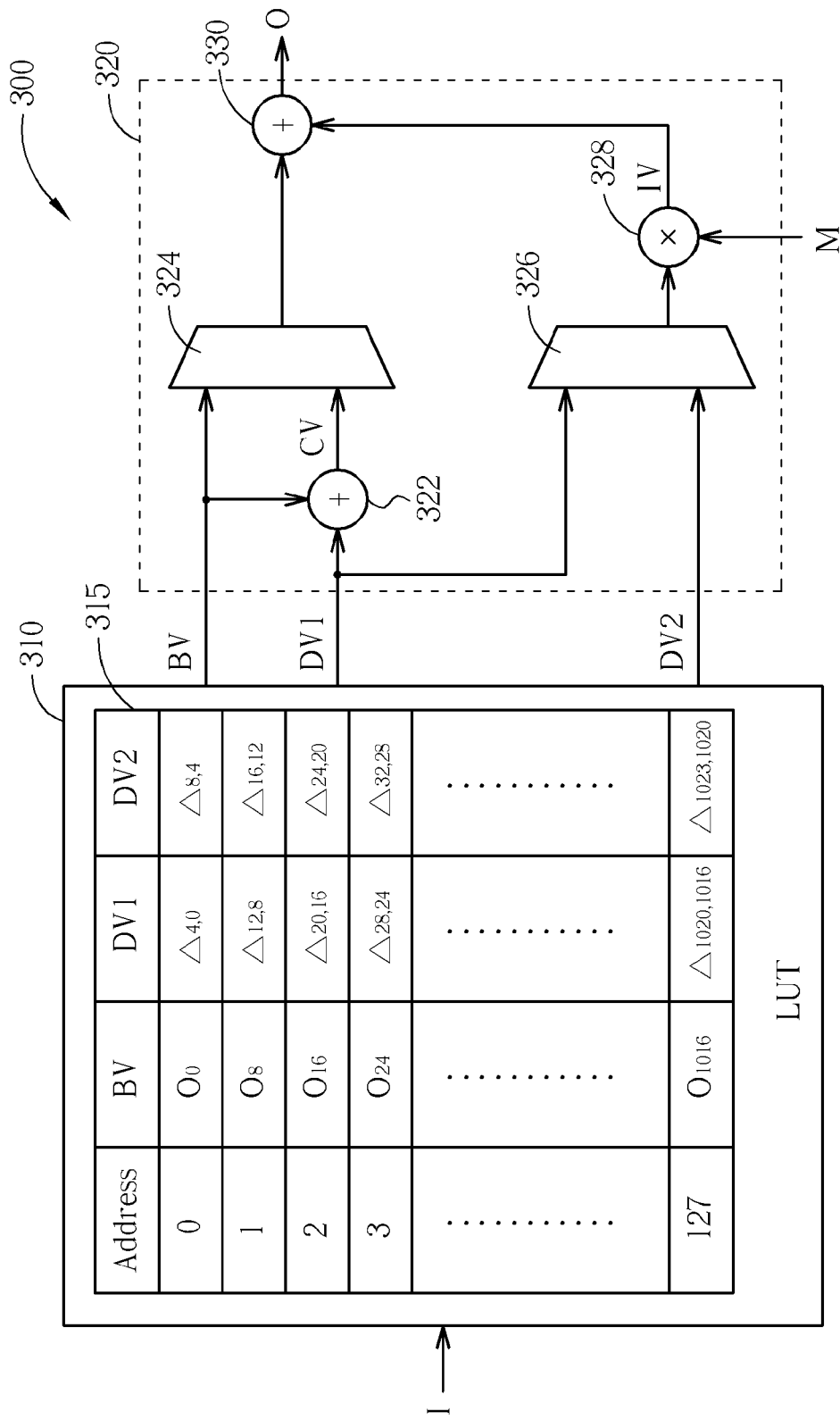
FIG. 3 shows a block diagram of a mapping apparatus according to a third embodiment of the present invention.

FIG. 3 shows a mapping apparatus 300 according to a third embodiment of the present invention. The mapping apparatus 300 generates an output value O according to an input value I. The mapping apparatus 300 comprises a look-up table 310 and an arithmetic circuit 320. The look-up table 310 includes a memory 315, and the memory 315 is utilized to store a plurality of basic values and a plurality of delta value sets (in this embodiment, each delta value set contains two delta values, which are a first delta value DV1 and a second delta value DV2). In the memory 315, each basic value corresponds to a delta value set, and the delta value set represents a difference between the basic value and another basic value adjacent to the basic value. For example, assume that the mapping apparatus 300 is used to implement a mathematical function having 1024 input values (from $I_0 \sim I_{1023}$) and 1024 corresponding output values (from $O_0 \sim O_{1023}$), the plurality of basic values could be set as $O_0$, $O_8$, $O_{16}$, $O_{24}$, ... $O_{1016}$, and the plurality of corresponding delta value sets (DV1, DV2) would be $(\Delta_{4,0}, \Delta_{8,4})$, $(\Delta_{12,8}, \Delta_{16,12})$, $(\Delta_{20,16}, \Delta_{24,20})$, ..., $(\Delta_{1020,1016}, \Delta_{1023,1020})$, where $O_{k+8}-O_k=\Delta_{k+8,k+4}+\Delta_{k+4,k}$, and $\Delta_{m,n}=O_m-O_n$ represent a difference between $O_m$ and $O_n$.

The arithmetic circuit 320 includes a first adder 322, a first multiplexer 324, a second multiplexer 326, a multiplier 328, and a second adder 330. The first adder 322 combines a basic value BV with a first delta value DV1 outputted by the LUT 310 to generate a combined value CV. The first multiplexer 324 receives the basic value BV or the combined value CV, and selectively chooses one of these two values as an output. The second multiplexer 326 receives the first delta value DV1 and a second delta value DV2 outputted by the LUT 310, and selectively chooses one of these two values as an output. Both the first multiplexer 324 and the second multiplexer 326 could be controlled according to the input value I. For example, if (I mod 8)<=4, than the first multiplexer 324 is controlled to output the basic value BV, and the second multiplexer 326 is controlled to output the first delta value DV1; if (I mod 8)>4, than the first multiplexer 324 is controlled to output the combined value CV, and the second multiplexer 326 is controlled to output the second delta value DV2. The multiplier 328 multiplies the output of the second multiplexer 326 (DV1 or DV2) with a multiplicand M to generate an increment value IV, where the multiplicand M is determined according to the input value I (ex. when (I mod 8)=4, M is determined to be 1; when (I mod 8)≠4, M is determined according to: M=(I mod 4)/4). The adder 330 adds the output of the first multiplexer 324 (BV or BV+DV1) with the increment value IV to generate the output value O.

Please take a look at some specific examples, when $I_{10}$ is used as the input value I, the LUT 310 outputs $O_8$, $\Delta_{12,8}$ and $\Delta_{16,12}$ as the basic value BV, the first delta value DV1, and the second delta value DV2 respectively. Since (10 mod 8)=2<4, the first multiplexer 324 is controlled to output the basic value BV (i.e. $O_8$), and the second multiplexer 326 is controlled to output the first delta value DV1 (i.e. $\Delta_{12,8}$). Since (10 mod 4)/4=²⁄₄, M is determined as ²⁄₄. Hence, the output value generated by the arithmetic circuit 320 is $O=O_8+(²⁄₄)\times\Delta_{12,8}$. Similarly, when $I_{15}$ is used as the input value I, the LUT 310 outputs $O_8$, $\Delta_{12,8}$ and $\Delta_{16,12}$ as the basic value BV, the first delta value DV1, and the second delta value DV2 respectively. Since (15 mod 8)=7>4, the first multiplexer 324 is controlled to output BV+DV1 (i.e. $O_8+\Delta_{12,8}$), and the second multiplexer 326 is controlled to output the second delta value DV2 (i.e. $\Delta_{16,12}$). Since (15 mod 4)/4=¾, M is determined as ¾. Hence, the output value generated by the arithmetic circuit 320 is $O=O_8+\Delta_{12,8}+(¾)\times\Delta_{16,12}$.

According to the present invention, the required memory space in these three embodiments is smaller than that is required in the prior art. Taking a mathematical function having 1024 input values (from $I_0 \sim I_{1023}$) and 1024 corresponding output values (from $O_0 \sim O_{1023}$) as an example. Assume that each one of the basic values (such as an $O_L$, an $O_H$, or a BV) occupies ten bits, the mapping apparatus 100 shown in FIG. 1 requires the memory 115 to have 256×2×10=5120 bits of memory space. In the second and third embodiments of the present invention, since fewer than 10 bits could be used to store a delta value (such as a DV, a DV1, or a DV2), the required memory spaces of the mapping apparatus shown in FIG. 2 and FIG. 3 are smaller. Assume that each one of the delta value requires three bits of memory space to be stored, the mapping apparatus 200 shown in FIG. 2 requires the memory 215 to have 256×(10+3)=3328 bits of memory space. The mapping apparatus 300 shown in FIG. 3 requires the memory 315 to have 128×(10+3+3)=2048 bits of memory space. In the present invention, using at least one multiplier would be enough in the mapping apparatus, further simplifying the structure of the mapping apparatus of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mapping method, comprising:
providing a look-up table, and utilizing the look-up table to store a plurality of basic values and a plurality of delta value sets, wherein each of the delta value sets represents a subtraction between a corresponding basic value and another basic value adjacent to the corresponding basic value;
utilizing the look-up table to determine a first basic value and a first delta value set according to an input value; and
generating an output value according to the first basic value and the first delta value set.

2. The method of claim 1, wherein the first delta value set comprises a first delta value.

3. The method of claim 2, wherein the step of generating the output value comprises:
multiplying the first delta value with a multiplicand to generate an increment value, the multiplicand being determined according to the input value; and
combining the first basic value with the increment value to generate the output value.

4. The method of claim 1, wherein the first delta value set comprises a first delta value and a second delta value.

5. The method of claim 4, wherein the step of generating the output value comprises:

multiplying the second delta value with a multiplicand to generate an increment value, the multiplicand being determined according to the input value; and combining the first basic value, the first delta value, and the increment value to generate the output value.

6. A mapping apparatus, comprising:

a look-up table for storing a plurality of basic values and a plurality of delta value sets, and for determining a first basic value and a first delta value set according to an input value, wherein the first delta value set represents a subtraction between the first basic value and another basic value adjacent to the first basic value in the look-up table; and an arithmetic circuit coupled to the look-up table, for generating an output value according to the first basic value and the first delta value set.

7. The mapping apparatus of claim 6, wherein the first delta value set comprises a first delta value.

8. The mapping apparatus of claim 7, wherein the arithmetic circuit comprises:

a multiplier coupled to the look-up table, for multiplying the first delta value with a multiplicand to generate an increment value, the multiplicand being determined according to the input value; and an adder coupled to the look-up table and the multiplier, for combining the first basic value with the increment value to generate the output value.

9. The mapping apparatus of claim 6, wherein the first delta value set comprises a first delta value and a second delta value.

10. The mapping apparatus of claim 9, wherein the arithmetic circuit comprises:

a first adder coupled to the look-up table, for combining the first basic value with the first delta value to generate a combined value;

a first multiplexer coupled to the look-up table and the first adder, for selectively outputting the first basic value or the combined value;

a second multiplexer coupled to the look-up table, for selectively outputting the first delta value or the second delta value;

a multiplier coupled to the second multiplexer, for multiplying the first delta value or the second delta value with a multiplicand to generate an increment value, the multiplicand being determined according to the input value; and a second adder coupled to the first multiplexer and the multiplier, for combining the first basic value or the combined value with the increment value to generate the output value.

11. The mapping method of claim 1, wherein the output value is between the first basic value and a second basic value adjacent to the first basic value.

12. The mapping method of claim 11, wherein the slope between the first basic value and the output value is substantially equal to the slope between the output value and the second basic value.

13. The mapping apparatus of claim 6, wherein the output value is between the first basic value and a second basic value adjacent to the first basic value.

14. The mapping method of claim 13, wherein the slope between the first basic value and the output value is substantially equal to the slope between the output value and the second basic value.

* * * * *